(12) United States Patent
Lin et al.

(10) Patent No.: US 8,900,988 B2
(45) Date of Patent: Dec. 2, 2014

(54) METHOD FOR FORMING SELF-ALIGNED AIRGAP INTERCONNECT STRUCTURES

(75) Inventors: Qinghuang Lin, Yorktown Heights, NY (US); Benjamin L. Fletcher, Elmsford, NY (US); Cyril Cabral, Jr., Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 565 days.

(21) Appl. No.: 13/088,083

(22) Filed: Apr. 15, 2011

(65) Prior Publication Data

US 2012/0261788 A1   Oct. 18, 2012

(51) Int. Cl.
*H01L 21/4763* (2006.01)
*H01L 21/44* (2006.01)
*H01L 21/768* (2006.01)
*H01L 21/311* (2006.01)

(52) U.S. Cl.
CPC ...... *H01L 21/31127* (2013.01); *H01L 21/7682* (2013.01); *H01L 21/76885* (2013.01)
USPC ........... 438/619; 438/669; 438/742; 438/631; 257/E21.581

(58) Field of Classification Search
CPC ............. H01L 21/7682; H01L 21/76831; H01L 21/76808; H01L 21/02203; H01L 21/31695; H01L 21/76834; H01L 21/764
USPC .......... 438/619, 669, 742, 631; 257/E21.581, 257/E21.579
See application file for complete search history.

(56) References Cited

U.S. PATENT DOCUMENTS

| | | | |
|---|---|---|---|
| 4,808,545 A | | 2/1989 | Balasubramanyam et al. |
| 5,461,003 A | * | 10/1995 | Havemann et al. ........... 438/666 |
| 5,651,857 A | | 7/1997 | Cronin et al. |
| 5,795,830 A | | 8/1998 | Cronin et al. |
| 5,976,768 A | | 11/1999 | Brown et al. |
| 5,981,148 A | | 11/1999 | Brown et al. |
| 6,007,968 A | | 12/1999 | Furukawa et al. |
| 6,014,422 A | | 1/2000 | Boyd et al. |
| 6,025,260 A | | 2/2000 | Lien et al. |
| 6,093,508 A | | 7/2000 | Cote |
| 6,114,082 A | | 9/2000 | Hakey et al. |
| 6,150,256 A | | 11/2000 | Furukawa et al. |
| 6,165,893 A | * | 12/2000 | Chung ........................ 438/623 |
| 6,184,041 B1 | | 2/2001 | Furukawa et al. |

(Continued)

FOREIGN PATENT DOCUMENTS

KR    100809901 B1 *  3/2008

OTHER PUBLICATIONS

Non Final Office Action issued on Jun. 18, 2013 for U.S. Appl. No. 13/197,325.

(Continued)

*Primary Examiner* — Shouxiang Hu
(74) *Attorney, Agent, or Firm* — Tutunjian & Bitetto, P.C.; Louis J. Percello

(57) ABSTRACT

Devices and methods for forming a self-aligned airgap interconnect structure includes etching a conductive layer to a substrate to form conductive structures with patterned gaps and filling the gaps with a sacrificial material. The sacrificial material is planarized to expose a top surface of the conductive layer. A permeable cap layer is deposited over the conductive structure and the sacrificial material. Self-aligned airgaps are formed by removing the sacrificial material through the permeable layer.

11 Claims, 5 Drawing Sheets

(56) References Cited

U.S. PATENT DOCUMENTS

| | | |
|---|---|---|
| 6,194,268 B1 | 2/2001 | Furukawa et al. |
| 6,200,726 B1 | 3/2001 | Chen et al. |
| 6,214,719 B1 | 4/2001 | Nag |
| 6,221,562 B1 | 4/2001 | Boyd et al. |
| 6,245,488 B1 | 6/2001 | Furukawa et al. |
| 6,284,439 B1 | 9/2001 | Holmes et al. |
| 6,313,492 B1 | 11/2001 | Hakey et al. |
| 6,338,934 B1 | 1/2002 | Chen et al. |
| 6,440,635 B1 | 8/2002 | Holmes et al. |
| 6,492,256 B2 | 12/2002 | Lee et al. |
| 6,492,732 B2 | 12/2002 | Lee et al. |
| 6,649,531 B2 | 11/2003 | Cote et al. |
| 6,780,753 B2 | 8/2004 | Latchford et al. |
| 6,805,109 B2 | 10/2004 | Cowan |
| 7,030,031 B2 | 4/2006 | Wille et al. |
| 7,041,748 B2 | 5/2006 | Lin et al. |
| 7,056,840 B2 | 6/2006 | Miller et al. |
| 7,071,532 B2 | 7/2006 | Geffken et al. |
| 7,091,611 B2 | 8/2006 | Ahn et al. |
| 7,138,329 B2 | 11/2006 | Lur et al. |
| 7,253,095 B2 | 8/2007 | Lur et al. |
| 7,265,013 B2 | 9/2007 | Furukawa et al. |
| 7,294,568 B2 * | 11/2007 | Goodner et al. ............... 438/619 |
| 7,294,934 B2 * | 11/2007 | Kloster et al. ................ 257/759 |
| 7,306,853 B2 | 12/2007 | Lin et al. |
| 7,338,896 B2 | 3/2008 | Vanhaelemeersch et al. |
| 7,344,827 B2 | 3/2008 | Takemura et al. |
| 7,361,454 B2 | 4/2008 | Kobayashi |
| 7,361,991 B2 | 4/2008 | Saenger et al. |
| 7,432,041 B2 | 10/2008 | Lin |
| 7,585,614 B2 | 9/2009 | Furukawa et al. |
| 7,709,370 B2 | 5/2010 | Allen et al. |
| 7,919,225 B2 | 4/2011 | Allen et al. |
| 2001/0021577 A1 | 9/2001 | Brown et al. |
| 2001/0054766 A1 | 12/2001 | Dirahoui et al. |
| 2002/0142531 A1 | 10/2002 | Hsu et al. |
| 2002/0158337 A1 * | 10/2002 | Babich et al. ................ 257/758 |
| 2003/0012539 A1 * | 1/2003 | Mule' et al. .................... 385/129 |
| 2003/0127426 A1 | 7/2003 | Chang et al. |
| 2004/0094821 A1 | 5/2004 | Lur et al. |
| 2004/0137241 A1 | 7/2004 | Lin et al. |
| 2005/0009305 A1 | 1/2005 | Anderson et al. |
| 2007/0099416 A1 | 5/2007 | Furukawa et al. |
| 2007/0166981 A1 | 7/2007 | Furukawa et al. |
| 2007/0249170 A1 | 10/2007 | Kewley |
| 2008/0008969 A1 | 1/2008 | Zhou et al. |
| 2008/0122106 A1 | 5/2008 | Nitta et al. |
| 2008/0142995 A1 | 6/2008 | Furukawa et al. |
| 2008/0150091 A1 | 6/2008 | Lin |
| 2008/0176396 A1 | 7/2008 | Futase et al. |
| 2008/0187731 A1 | 8/2008 | Allen et al. |
| 2008/0265377 A1 | 10/2008 | Clevenger et al. |
| 2009/0079075 A1 | 3/2009 | Lin et al. |
| 2009/0079076 A1 | 3/2009 | Lin et al. |
| 2009/0081418 A1 | 3/2009 | Allen et al. |
| 2009/0149026 A1 | 6/2009 | Zhou et al. |
| 2009/0174067 A1 | 7/2009 | Lin |
| 2009/0233226 A1 | 9/2009 | Allen et al. |
| 2010/0009131 A1 | 1/2010 | Basker et al. |
| 2010/0028801 A1 | 2/2010 | Holmes et al. |
| 2010/0112463 A1 | 5/2010 | Yune |
| 2010/0197096 A1 | 8/2010 | Johnson et al. |
| 2010/0314768 A1 | 12/2010 | Darnon et al. |
| 2011/0130006 A1 | 6/2011 | Abatchev et al. |
| 2011/0304053 A1 | 12/2011 | Lin et al. |
| 2012/0018891 A1 | 1/2012 | Lin |

OTHER PUBLICATIONS

Non Final Office Action issued on Feb. 26, 2013 for U.S. Appl. No. 13/197,325.

Lin, Q., et al. "Self-Aligned Airgap Interconnect Structures and Methods of Fabrication" Non Final Office Action for U.S. Appl. No. 13/088,110 mailed on Nov. 5, 2013. (18 Pages).

Final Office Action mailed on May 27, 2014 for U.S. Appl. No. 13/606,788.

Maenhoudt, M., et al. "Alternative Process Schemes for Double Patterning That Elminate the Intermediate Etch Step" Proc. of SPIE, vol. 6924, 69240P. Feb. 2008. pp. 1-12.

Jung, W., et al. "Patterning With Amorphous Carbon Spacer for Expanding the Resolution Limit of Current Lithography Tool" Proc. of SPIE, vol. 6520, 65201C. Feb. 2007. pp. 1-9.

Jung, W., et al. "Patterning With Spacer for Expanding the Resolution Limit of Current Lithography Tool" Proc. of SPIE, vol. 6156, 61561J. Feb. 2006. pp. 1-9.

Final Office Action for U.S. Appl. No. 13/088,110 mailed on Mar. 20, 2014.

* cited by examiner

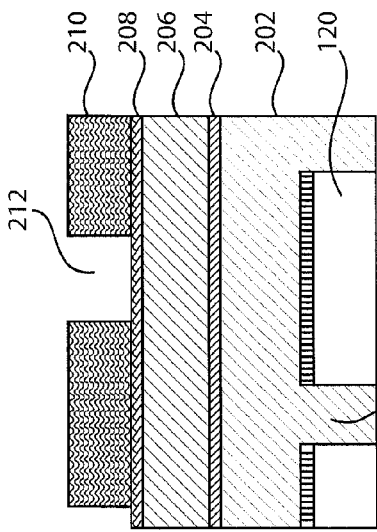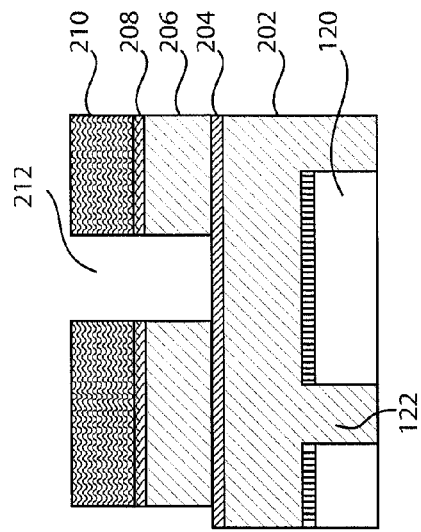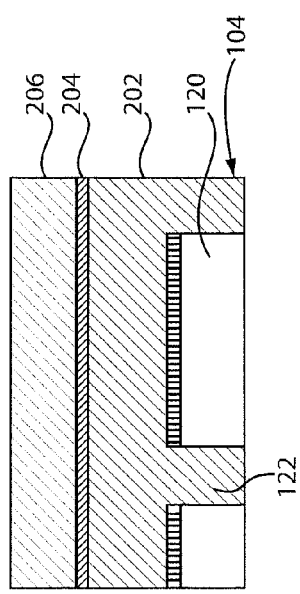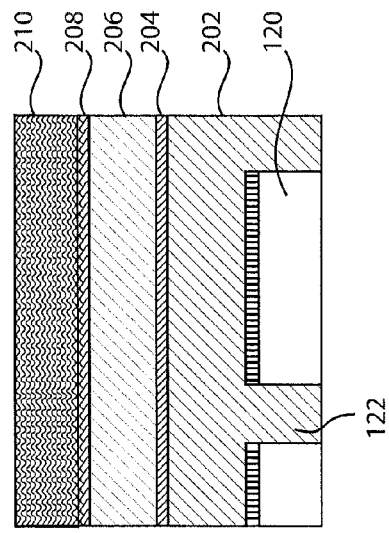

US 8,900,988 B2

METHOD FOR FORMING SELF-ALIGNED AIRGAP INTERCONNECT STRUCTURES

RELATED APPLICATION INFORMATION

This application is related to commonly assigned application Ser. No. 13/088,504, entitled: INTERCONNECT STRUCTURE AND METHOD FOR FABRICATING ON-CHIP INTERCONNECT STRUCTURES BY IMAGE REVERSAL, and commonly assigned application Ser. No. 13/088,110, entitled: MIDDLE OF LINE STRUCTURES AND METHODS FOR FABRICATION, both filed concurrently herewith and incorporated herein by reference.

BACKGROUND

1. Technical Field

The present invention relates to semiconductor interconnect structures and fabrication methods, and more particularly to interconnect structures having airgaps formed therebetween using a self-aligned process.

2. Description of the Related Art

The speed of propagation of interconnect signals is an important factor controlling overall circuit speed as feature sizes are reduced, and the number of devices per unit area and the number of interconnect levels are increased. Throughout the semiconductor industry, there has been a strong drive to reduce the dielectric constant, k, of the interlayer dielectric (ILD) materials used to electrically insulate metal lines. The dielectric constant, k, of ILD materials has been steadily reduced. As a result, interconnect signals travel faster through conductors due to a reduction in resistance-capacitance (RC) delays. The ultimate dielectric constant of unity can be achieved by incorporating an airgap or vacuum as the electrically insulator between metal structures in an interconnect.

Airgap interconnects are typically formed using a mask layer over a chemical vapor deposited (CVD) interlevel dielectric (ILD) layer, patterning the mask layer, etching airgap holes and removing residual materials in the holes to form the airgaps. The patterning of these airgap structures with sub-design rule dimensions can be formed by lithographic techniques or self-assembly techniques. Both patterning processes for forming these airgaps include many opportunities for misalignment of the airgap structure over the conductive structures. Consequently, airgap interconnects thus formed suffer from reliability degradation due to these misaligned holes which form the airgap structures.

SUMMARY

Devices and methods for forming a self-aligned airgap interconnect structure includes etching a conductive layer to a substrate to form conductive structures with patterned gaps and filling the gaps with a sacrificial material. The sacrificial material is planarized to expose a top surface of the conductive layer. A permeable cap layer is deposited over the conductive structure and the sacrificial material. Self-aligned airgaps are formed by removing the sacrificial material through the permeable layer.

A method for forming a self-aligned airgap interconnect structure includes depositing a second conductive layer on a first conductive layer formed on a substrate; patterning the second conductive layer to form first trenches down to the first conductive layer; patterning the second conductive layer to form second trenches down to the first conductive layer and transferring the first trenches down to the substrate to form openings extending between the first and second conductive layers; filling the openings with a sacrificial material; planarizing to expose a top surface of the second conductive layer; depositing a permeable cap layer over the conductive structure and the sacrificial material; and forming self-aligned airgaps by removing the sacrificial material through the permeable layer.

An integrated circuit device includes at least a pair of conductive structures configured by etching a conductive layer to form sidewalls extending through a thickness of the conductive layer. A self-aligned airgap is formed between the pair of conductive structures and being bounded by a substrate, the sidewalls of the respective conductive structures and a permeable cap layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIGS. 2A-2J are cross-sectional views showing a process for forming self-aligned airgaps in a dual damascene embodiment in accordance with the present principles.

DETAILED DESCRIPTION OF PREFERRED EMBODIMENTS

Figure 1A:
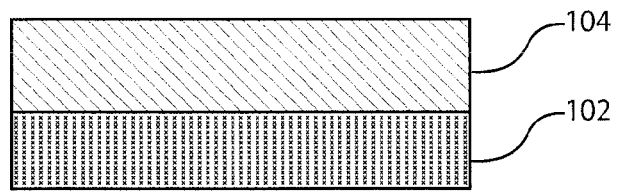
FIGS. 1A-1J are cross-sectional views showing a process for forming self-aligned airgaps in a single damascene embodiment in accordance with the present principles.

In accordance with the present principles, self-aligned airgaps and methods for their fabrication are provided. The self-aligned airgaps represent a reduction in the number of fabrication steps and associated costs for airgap interconnect structures. Further, the present principles fabricate reliable airgap structures using a self-aligned metal etch fabrication process which reduces or eliminates misalignment between conductors of the airgap interconnect structures.

The present principles include embodiments that employ a metal etch integration. Instead of relying on an interlevel dielectric layer to form the metal structures (e.g., single or dual damascene) by depositing a metal inside of trenches or vias, the metal structures are formed by etching a conductive layer. Metal or conductive structures are etched to form openings. The openings are filled with a sacrificial gap fill material. The gap fill material is removed through a permeable barrier to leave the self-aligned airgap structure.

In the following description, numerous specific details are set forth, such as particular structures, components, materials, dimensions, processing steps and techniques, to provide a thorough understanding of the present principles. However, it will be appreciated by one of ordinary skill in the art that these specific details are illustrative and should not be construed as limiting.

It will be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It is to be understood that the present invention will be described in terms of a given illustrative architecture having a semiconductor wafer or substrate; however, other architectures, structures, substrate materials and process features and steps may be varied within the scope of the present invention.

Circuits or structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

FIGS. 1A-1J show an illustrative embodiment for forming a single damascene structure with self-aligned airgaps in accordance with the present principles. Referring now to the drawings in which like numerals represent the same or similar elements and initially to FIG. 1A, a substrate 102 may include a semiconductor substrate, e.g., silicon, GaAs, silicon on insulator, or may include lower level metal layers in interlevel dielectric materials. The substrate 102 may include an electrically semiconducting material, an insulating material, a conductive material, devices or structures made of these materials or any combination thereof (e.g., a lower level of an interconnect structure). When the substrate 102 is comprised of a semiconducting material, any semiconductor such as Si, SiGe, SiGeC, SiC, Ge alloys, GaAs, InAs, InP and other III/V or II/VI compound semiconductors, or organic semiconductors may be employed. The substrate 102 may also be a flexible substrate including devices that are suitable for high-speed roll-to-roll processing. In addition to these listed types of semiconducting materials, substrate 102 may also be a layered semiconductor such as, for example, Si/SiGe, Si/SiC, silicon-on-insulators (SOIs) or silicon germanium-on-insulators (SGOIs). These semiconductor materials may form a device, devices or structures, which may be discrete or interconnected. These devices and device structures may be for computation, transmission, storage or display of information, such as logic devices, memory devices, switches or display devices.

When the substrate 102 is an electrical insulating material, the insulating material can be an organic insulator, an inorganic insulator or a combination thereof including multilayers. The substrate 102 may also include a patternable low-k dielectric material as well. These electrical insulating materials may be part of a device, devices or structures, which may be discrete or interconnected. These devices and structures may be for logic applications or memory applications. When the substrate 102 is an electrically conducting material, the substrate may include, for example, polysilicon, an elemental metal, an alloy including at least one elemental metal, a metal silicide, a metal nitride or combinations thereof including multilayers. When the substrate 102 includes a semiconducting material, one or more semiconductor devices such as, for example, complementary metal oxide semiconductor (CMOS) devices, strained silicon devices, carbon-based (carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated thereon.

A conductive layer 104 is deposited on the substrate 102. The conductive layer may be deposited by a deposition process such as, for example, chemical vapor deposition (CVD), plasma enhanced chemical vapor deposition (PECVD), atomic layer deposition (ALD), chemical solution deposition, sputtering (PVD), plating (electro or electroless) or evaporation. The conductive layer 104 may include a metal, a metal alloy, doped polysilicon, etc. The conductive layer 104 may include, e.g., copper, aluminum, tungsten, silver, gold, molybdenum, ruthenium, nickel, cobalt, etc. or alloys thereof. In a preferred embodiment, the conductive layer 104 is tungsten or an alloy thereof. The thickness of the conductive layer 104 may be about 5 nm to about 5000 nm, preferably 10 nm to 500 nm.

Figure 1B:
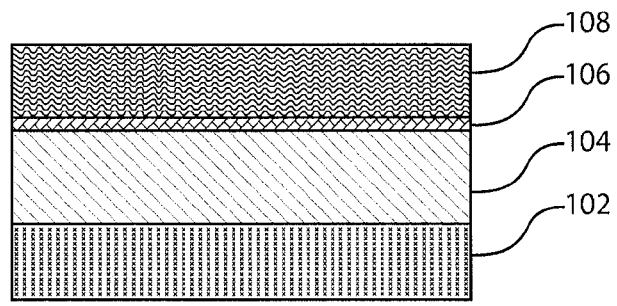

In FIG. 1B, an antireflection coating (ARC) 106 is formed on a surface of the conductive layer 104 followed by a photoresist layer 108 deposition. The ARC 106 may be a single layer, multilayer or a graded layer with a composition that varies along the vertical direction. The ARC 106: (i) acts as an antireflective coating (ARC) during a lithographic patterning process; (ii) prevents resist poisoning by the substrate 102 or conductive layer 104; (iii) provides a vertical wall profile and sufficient etch selectivity; and (iv) is compatible with conventional BEOL integration and produces reliable hardware.

Antireflective coatings are known to those skilled in the art and include, for example, organic homopolymers or copolymers of polyesters, polyimides, polyacrylates, polymethacrylates, polysulfones, and amorphous carbon that satisfy all of the characteristics of ARC 106 mentioned above. The ARC 106 may be applied by spin-on techniques, spray on techniques, dipping, etc. Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed and may be deposited, for example, by plasma-enhanced chemical vapor deposition, spin-on techniques, dipping, etc. When ARC 106 is a multilayer ARC, the deposition of each layer may be the same or a combination of deposition methods can be used.

After applying ARC 106, particularly those from a liquid phase, a post deposition baking step is usually needed to remove unwanted components, such as solvent, and to effect crosslinking. The post deposition baking step of ARC 106 is typically, but not necessarily always, performed at a temperature from 80° C. to 300° C., with a baking temperature from 120° C. to 200° C. being even more typical. Other post-deposition treatments may also be performed.

The photoresist layer 108 may include chemically amplified photoresists, non-chemically amplified photoresists, positive-tone or negative tone. Processing of layer 108 may include a deposition process including, for example, spin-on-coating, dip coating, brush coating, and ink-jet dispensing. After applying the material of layer 108, a post deposition baking step may be performed to remove unwanted components, such as solvent. When performed, the baking step is conducted at a temperature from 40° C. to 200° C., with a baking temperature from 60° C. to 140° C. being even more preferred. The duration of the baking step varies from 10 seconds to 600 seconds and is not critical.

The thickness of the layer 108 may vary depending on the requirements of a chip being fabricated, the method being employed to form the same, and the make-up of the material of layer 108. Layer 108 may have a thickness, e.g., from 1 nm to 50,000 nm, with a thickness from 20 nm to 5000 nm being preferred.

Figure 1C:
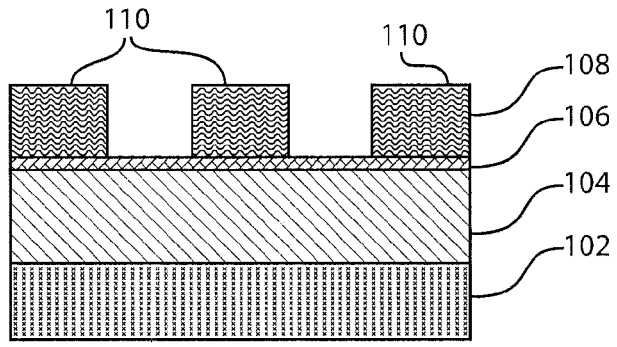

In FIG. 1C, a pattern-wise exposing process can be accomplished in a variety of ways, including, for example, exposure through a mask with a lithography stepper or a scanner with an exposure light source of G-line, I-line (365 nm), DUV (248 nm, 193 nm, 157 nm, 126 nm), Extreme UV (13.4 nm, 6.5 nm), an electron beam, an ion beam, etc. The exposing process may be performed in a dry mode or an immersion mode. The exposing process may be performed with a single exposure or multiple exposures. The pattern-wise exposing process may include direct writing without the use of a mask with, for example, light, electron beam, ion beam, and scanning probe lithography. Other patterning techniques that can be used include contact printing techniques such as nanoimprint lithography, embossing, micro-contact printing, replica molding, microtransfer molding, micromolding in capillaries and solvent-assisted micromolding, thermal assisted embossing, inject printing, and the like.

An optional post-exposure baking may be employed to effect the photochemical reactions. When performed, the baking step is conducted at a temperature from 60° to 200° C., with a baking temperature from 80° to 140° C. being even more typical. The duration of the baking step varies and is not critical to the practice of the present invention.

The photoresist 108 is developed to form features 110 with vias or trenches therebetween. After exposure and post-exposure baking, latent images or patterns are developed into relief images or patterns 110 with an appropriate developer, usually an aqueous base solution, such as, e.g., 0.26N tetramethylammoniahydroxide (TMAH) solution.

Figure 1D:
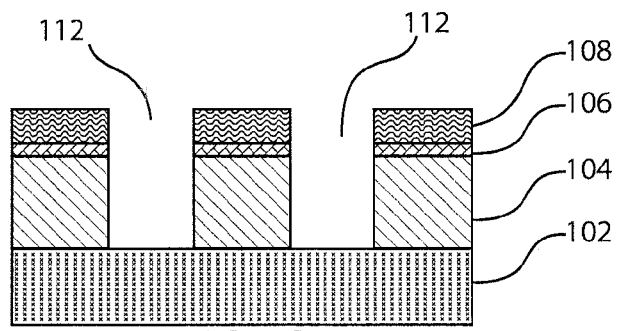

In FIG. 1D, the pattern 110 of the photoresist layer 108 is employed to etch open the ARC layer 106 and to transfer the pattern into the conductor layer 104. The ARC 106 and conductive layer 104 are etched using for example, a reactive ion etch (RIE) process with an appropriate chemistry. Other etching processes may also be employed. The etching forms openings or gaps 112. When tungsten is used as the conductive metal, the preferred etch chemistry includes He, Cl, and F reactive species. The reactive ion etching may be carried out in a transformer coupled plasma (TCP) etcher at 40° C. resulting in a W etch rate on the order of 1 nm per second.

Figure 1E:
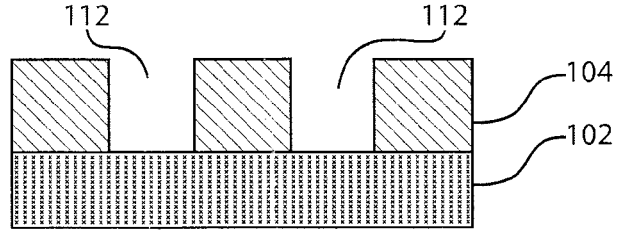
Figure 1F:
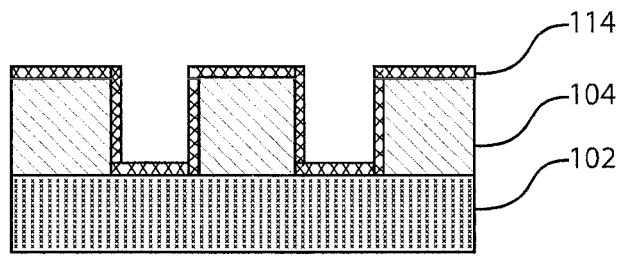

In FIG. 1E, the photoresist 108 and ARC 106 are removed from the surface of the conductive layer 104. This may be performed using an etching method, including a wet etching and dry etching. The wet etching method includes removal of the remaining photoresist and ARC with an appropriate chemical or a combination of chemicals. The dry etching method includes reactive ion etching using an etching chemistry of, e.g., oxygen, nitrogen, ammonia or a combination thereof. In FIG. 1F, a conformal protective dielectric coating 114 is deposited on exposed surfaces of the conductive layer 104. The dielectric coating 114 provides a solid state dielectric material on opposing lateral sides of airgaps to be formed in later steps. The conformal formation of dielectric coating 114 is optional. The dielectric coating 114 may be formed on surfaces of conductive layer 104 utilizing a deposition process such as, for example, chemical vapor deposition (CVD), plasma enhanced chemical vapor deposition (PECVD), atomic layer deposition (ALD), chemical solution deposition, or evaporation. The dielectric coating 114 may include any suitable dielectric material such as, for example, SiC, SiN, $SiO_2$, a carbon doped oxide, a nitrogen and hydrogen doped silicon carbide SiC(N,H) or multilayers thereof. In a preferred embodiment, the deposition of the conformal dielectric layer 114 is by atomic layer deposition. The thickness of the conformal dielectric layer may be $1/100$ to $1/2$ of the smallest opening within the conductive layer, preferably $1/20$ to $1/4$ of the smallest opening.

Figure 1G:
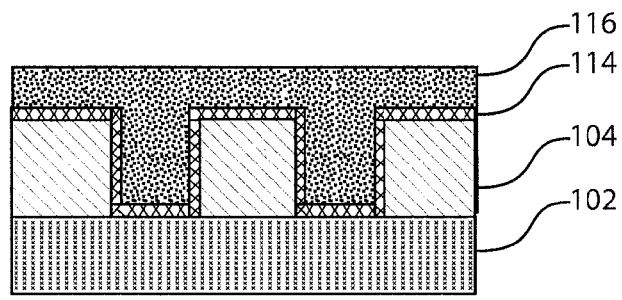

In FIG. 1G, a sacrificial material 116 is deposited over the dielectric coating 104 to fill gaps between portions of the conductive layer 104. The sacrificial material 116 may be deposited using a chemical solution deposition, such as spin coating, dip coating spray coating, or a chemical vapor deposition (CVD) or other deposition method. The sacrificial material 116 may include a polymer, a copolymer of two or more monomers or a blend of polymers or copolymers wherein the polymer, copolymer or blend of polymers or copolymers can be completely decomposed under heat, irradiation (UV, e-beam), plasma, microwave or a combination thereof and forms products that can be removed through a permeable cap layer. Examples of the sacrificial material 116 include a hydrocarbon polymer such as, e.g., polynorbornenes, polysulfones, polyethers, polyimides, diamond-like carbon, etc. If the deposition is a chemical solution deposition, such as spin coating, dip coating spray coating, a post deposition baking step is generally needed to remove solvent and/or to induce chemical crosslinking of the polymers. The thickness of the sacrificial material 116 may be, e.g., between about 6 nm to about 5000 nm, preferably about 11 nm to about 500 nm.

Figure 1H:
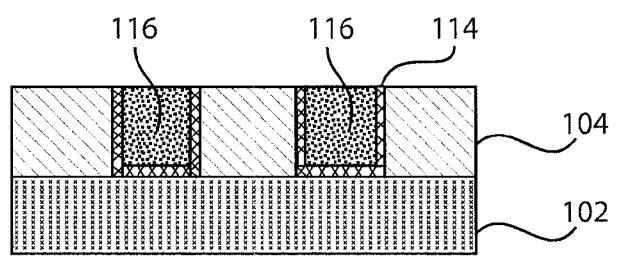

In FIG. 1H, a planarization is performed to remove excess sacrificial material 116 from a top surface of the conductive layer 104 to expose the top of the conductive layer 104. Note that the dielectric coating 114 is removed from the top surface of the conductive layer 104 to expose the conductive material of layer 104. The planarization process includes dry etching, wet etching, polishing or other methods to expose the top surface. In one embodiment, the planarization process is a dry etching by reactive ion etching using a chemistry comprising, e.g., oxygen, nitrogen, ammonia and the like. In another embodiment, the planarization process is a wet etching by an appropriate chemical or a combination of chemicals that removes part of the excessive sacrificial material 116.

Figure 1I:
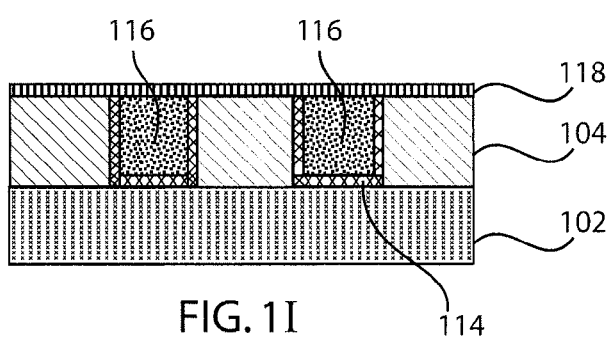

In FIG. 1I, a permeable cap layer 118 is formed over the conductive layer 104 and the sacrificial material 116 remaining within the conductive layer gaps. The cap layer 118 is formed by utilizing a deposition process such as, for example, chemical vapor deposition (CVD), plasma enhanced chemical vapor deposition (PECVD), atomic layer deposition (ALD), chemical solution deposition, sputtering (PVD), plating (electro or electroless) or evaporation. The cap layer 118 may include a dielectric material with one or more of Si, Ge, C, N, O, H. The cap layer 118 is preferably permeable to permit decomposition products of the sacrificial material 116 to diffuse through the cap layer 118 as will be described. The dielectric cap layer 118 comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap 118 can be a continuous layer or a discontinuous layer. It can also be a select cap, such as CoWP. The thickness of the dielectric cap 118 may vary depending on the technique used to form the same as well as the material make-up of the layer. The dielectric cap layer 118 may have, e.g., a thickness from about 5 to about 55 nm, with a thickness from about 20 to about 45 nm being more preferable.

In one embodiment, the dielectric cap layer 118 comprises a polymer of one monomer or a copolymer of at least two monomers selected from siloxane, silane, carbosilane, oxycarbosilane, organosilicates, silsesquioxanes and the like. The dielectric cap layer 118 may also comprise a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Additionally, the dielectric layer 118 may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Figure 1J:
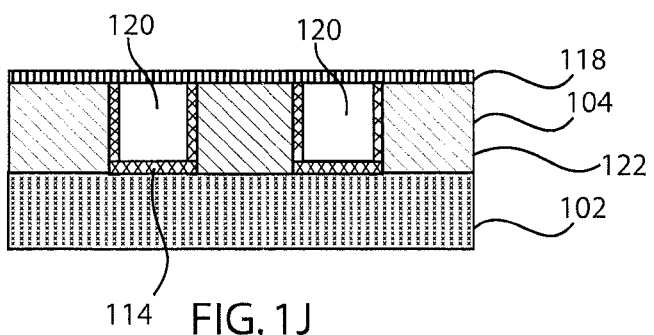

In FIG. 1J, self-aligned airgap interconnect structures are formed by removing the sacrificial material 116 through the permeable cap layer 118. This process includes heat, irradiation (UV, ion beam, electron beam), plasma, microwave or a combination thereof. The conditions for each of the removal processes can be selected which substantially decomposes and removes the sacrificial material 116.

In one embodiment, this removal of the sacrificial material 116 is a combined UV/thermal treatment. This combined UV/thermal treatment is carried by a UV/thermal treatment module under vacuum or inert atmosphere, such as a $N_2$, He or Ar atmosphere. The UV/thermal treatment temperature may be from, e.g., 100° C. to 500° C., with a cure temperature from 300° to 450° C. being preferable. The duration of the UV/thermal treatment may be from 0.5 min to 30 min with a duration from 1 min to 10 min being preferable. Once the sacrificial material 116 is removed self-aligned airgaps 120 are formed. These airgaps 120 are self-aligned and directly aligned with the conductive structures 122 as the airgaps 120 are formed directly between the conductive structures 122.

This completes a single damascene structure with self-aligned airgaps. The self-aligned single damascene airgap interconnect structure can be repeated to form multi-level self-aligned airgap interconnect structures. A dual-damascene structure may build on this structure and also include airgaps. However, it should be understood that airgaps may be formed between interconnect structures. It should also be understood that airgaps may be formed on one or more levels of a metal structure for a semiconductor device and even only on a portion of one or more levels of the semiconductor device.

FIGS. 2A-2J show an illustrative embodiment for forming a dual damascene structure with self-aligned airgaps in accordance with the present principles. Referring now to the drawings in which like numerals represent the same or similar elements and initially to FIG. 2A, the structures 122 of FIG. 1J are depicted without the optional dielectric coating 114. Cap layer 118 has been opened up over conductive structures 122, but remains over airgaps 120. It should be understood that the airgaps 120 are optional and may be replaced by dielectric material. A conductive layer 202 is formed over the cap layer 118 and in contact with conductive structures 122. Conductive layer 202 may include similar materials and similar deposition processes as described for conductive layer 104.

An optional conductive etch stop layer 204 is formed on the conductive layer 202. The etch stop layer 204 may include a conductive material, such as W, Ti, Ta their alloys or nitrides or other suitable materials which can provide a selective etch with respect to other conductive layers. Another conductive layer 206 is deposited on the etch stop layer 204 (or conductive layer 202, if the etch stop layer 204 is not employed). Conductive layer 206 may include similar materials and similar deposition processes as described for conductive layer 104.

In FIG. 2B, an anti-reflective coating (ARC) 208 and a photoresist 210 are deposited. The ARC 208 may be formed using materials and processes as described for ARC 106. The photoresist 210 may be formed using materials and processes as described for photoresist 108.

Figure 2E:
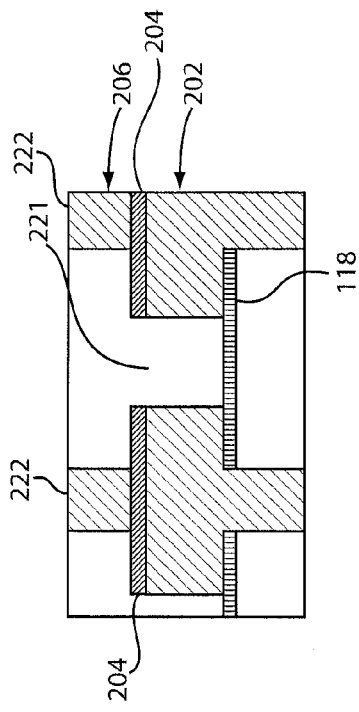

In FIG. 2C, a pattern is formed that includes vias or trenches 212 by pattern-wise exposure to irradiation, e.g., UV light and selective removal with a developer. In FIG. 2D, the pattern is transferred into the ARC 208 and a top portion of the conductive layer 206 by an etch process. The etch may include a RIE, wet etch, etc. If the etch stop layer 204 is present, the etching stops on the etch stop layer 204. In FIG. 2E, the photoresist 210 and ARC 208 are removed by the same process as used to remove photoresist 108 and ARC 106. A trench 214 between portions of the conductive layer 206 remains.

Figure 2G:
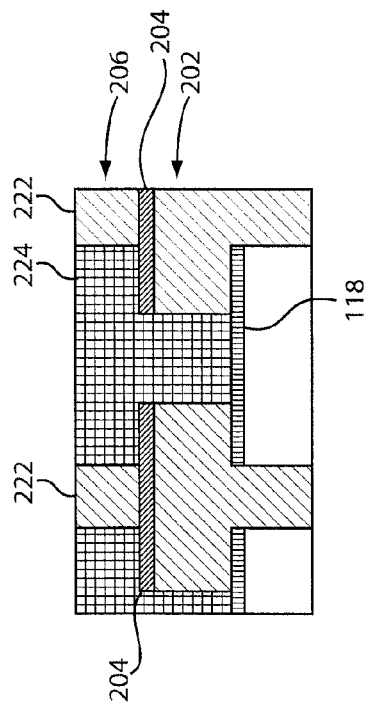
Figure 2F:
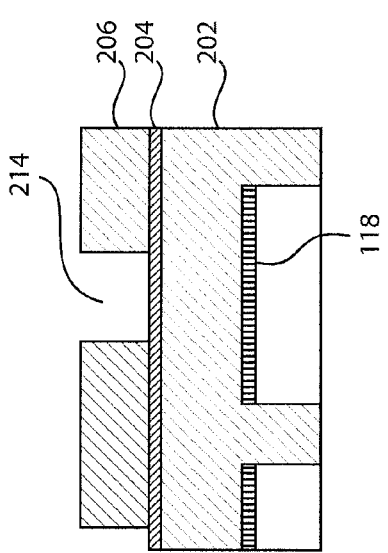

In FIG. 2F, another anti-reflective coating (ARC) 216 and photoresist layer 218 are formed and may include materials and formation processes as described. A pattern 220 (via and/or trench) is formed in the ARC 216 and photoresist layer 218 by pattern-wise exposure to irradiation, e.g., UV light, selective removal with a developer and reactive ion etching. In FIG. 2G, the pattern of trench 220 is transferred down through the etch stop layer 204 and into conductive layer 202 down to cap layer 118 to form pattern 221. In addition, portions of conductive layer 206 that are not protected by the pattern of photoresist 218 are also etched to form dual-damascene conductor structures 222. The photoresist layer 218 and ARC 216 are removed by the same process as used to remove photoresist 108 and ARC 106. Optionally, a conformal protective dielectric coating (not shown) similar to that of dielectric coating 114 may be formed on exposed surfaces of conductors 222.

Figure 2H:
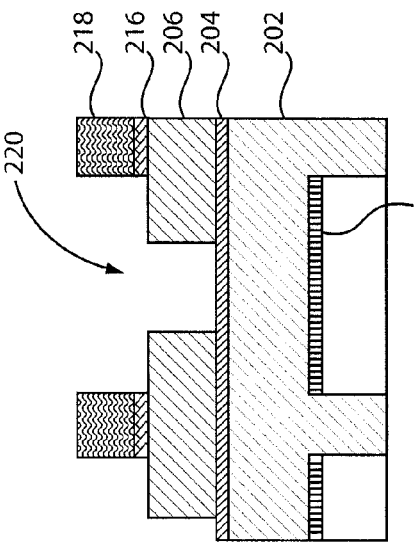

In FIG. 2H, gaps 221 shown in FIG. 2G are filled with a sacrificial material 224. Sacrificial material 224 is formed of similar materials and processes as for the sacrificial material 116. A planarization process is used to expose a top surface of the conductive layer 206. This planarization is the same as the one used to remove excessive sacrificial material 116.

Figure 2I:
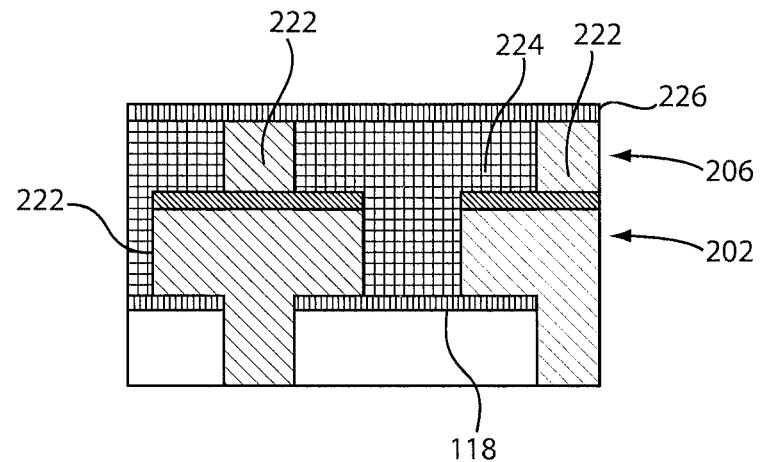
Figure 2J:
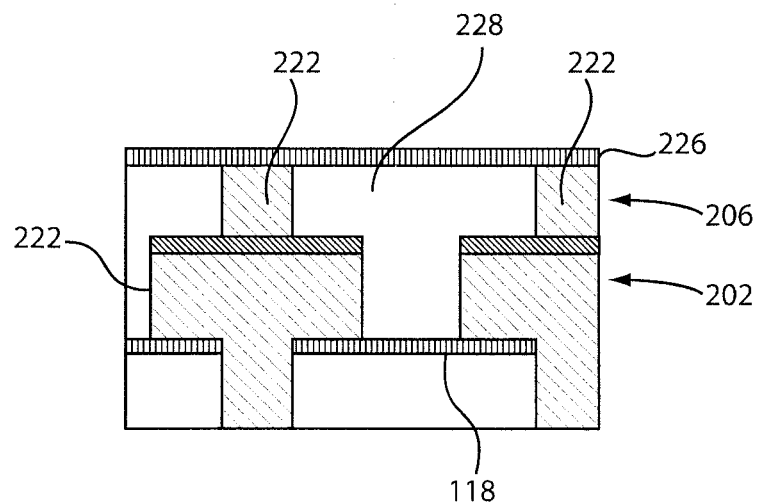

In FIG. 2I, a dielectric cap layer 226 is deposited directly over a surface of the conductive layer 206 and the sacrificial material 224. The dielectric cap layer 226 is formed from similar materials and using similar processes as described for dielectric cap layer 118. In FIG. 2J, self-aligned airgap interconnect structures are formed by removing the sacrificial material 224 through the permeable cap layer 226. This removal process is the same as the one used to remove sacrificial material 116. Once the sacrificial material 224 is removed, self-aligned airgaps 228 are formed. These airgaps 228 are self-aligned and are directly aligned with the conductive structures 222 as the airgaps 228 are formed directly between the conductive structures 222.

This completes a dual damascene structure with self-aligned airgaps. Single damascene, dual-damascene or other structures may build on this structure and may also include airgaps. It should also be understood that airgaps may be formed on one or more levels of a metal structure for a semiconductor device and even only on a portion of one or more levels of the semiconductor device. The airgaps may have a stepped shape and may continuously extend through a plurality of levels. Although conductive structures of any size would benefit from the present principles, the present embodiments are particularly useful for metal lines and contacts having linewidths of less than about 90 nm.

Having described preferred embodiments for self-aligned airgap interconnect structures and methods of fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a self-aligned airgap interconnect structure, comprising:
   etching a conductive layer to a substrate to form conductive structures with patterned gaps;
   forming a conformal dielectric layer over sidewall surface and top surface portions of the conductive structures and gaps;
   filling the gaps with a sacrificial material to at least fill the gaps;
   planarizing to expose the top surface of the conductive structures by removing the portion of the conformal dielectric layer that is present on the top surface of the conductive structures;
   depositing a permeable cap layer over the conductive structure and the sacrificial material; and
   forming self-aligned airgaps by removing the sacrificial material through the permeable layer such that the airgaps are formed directly over the dielectric layer, which is formed directly over the substrate.

2. The method as recited in claim 1, wherein the permeable cap layer includes a dielectric material including one or more of Si, Ge, C, N, O, H.

3. The method as recited in claim 1, wherein removing the sacrificial material through the permeable layer includes breaking down and diffusing the sacrificial material through the permeable layer by using one or more of the heat, irradiation, microwaves and plasma.

4. The method as recited in claim 1, wherein the sacrificial material includes a polymer, a copolymer of two or more monomers or a blend of polymers or copolymers wherein the polymer, copolymer or blend of polymers or copolymers is decomposable under one or more of heat, irradiation, plasma or microwaves and forms products that are removable through the permeable cap layer.

5. The method as recited in claim 1, wherein the substrate includes a semiconductor material or a conductive component of a lower layer.

6. The method as recited in claim 1, wherein the conductive structures formed by etching the conductive layer form single damascene structures.

7. The method as recited in claim 1, wherein the permeable cap layer has a thickness between 20 to 45 nm.

8. The method as recited in claim 1, wherein the conformal dielectric layer has a thickness between $1/100$ to $1/2$ of a smallest opening of the patterned gaps.

9. The method as recited in claim 1, wherein the conformal dielectric layer has a thickness between $1/20$ to $1/4$ of a smallest opening of the patterned gaps.

10. The method as recited in claim 1, wherein the permeable cap layer includes a polymer of one monomer, a copolymer of two or more monomers or a blend of polymers or copolymers, the monomer including at least one of siloxane, silane, carbosilane, oxycarbosilane, organosilicates, silsesquioxanes.

11. The method as recited in claim 1, wherein the permeable cap layer includes a polymer of one monomer, a copolymer of two or more monomers or a blend of polymers or copolymers, the monomer including at least one of alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

* * * * *